(12) United States Patent
Lin

(10) Patent No.: US 11,476,776 B1
(45) Date of Patent: Oct. 18, 2022

(54) VOLTAGE-CONTROLLED DELAY BUFFER OF WIDE TUNING RANGE

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 10 days.

(21) Appl. No.: 17/242,396

(22) Filed: Apr. 28, 2021

(51) Int. Cl.
*H02M 7/537* (2006.01)
*H03K 5/01* (2006.01)
*H03K 5/00* (2006.01)

(52) U.S. Cl.
CPC ............. *H02M 7/537* (2013.01); *H03K 5/01* (2013.01); *H03K 2005/00078* (2013.01)

(58) Field of Classification Search
CPC .... H02M 7/00; H02M 7/537; H03K 2005/00; H03K 2005/00078; H03K 5/00; H03K 5/01
USPC ........................................................ 327/158
See application file for complete search history.

(56) References Cited

U.S. PATENT DOCUMENTS

| | | | | |
|---|---|---|---|---|
| 5,175,445 A | * | 12/1992 | Kinugasa | H03K 19/00384 326/87 |
| 5,459,424 A | * | 10/1995 | Hattori | H03K 5/133 327/288 |
| 5,973,533 A | * | 10/1999 | Nagaoka | H03K 19/00384 327/263 |
| 2014/0159791 A1 | * | 6/2014 | Chou | H03K 5/1252 327/292 |
| 2014/0160607 A1 | * | 6/2014 | Reimann | H01L 27/0255 361/56 |
| 2020/0304115 A1 | * | 9/2020 | Qu | H03K 5/133 |

* cited by examiner

*Primary Examiner* — Menatoallah Youssef
*Assistant Examiner* — Dave Mattison
(74) *Attorney, Agent, or Firm* — McClure, Qualey & Rodack, LLP

(57) ABSTRACT

A voltage-controlled delay buffer includes a plurality of inverters configured in a cascade topology to receive an input signal from a source circuit and output an output signal to an output circuit. The plurality of inverters includes a voltage-controlled inverter controlled by a control signal having a first voltage and a second voltage. The voltage-controlled inverter includes a PMOS transistor configured to assist a low-to-high transition of an outgoing signal, and an NMOS transistor configured to assist a high-to-low transition of the outgoing signal. Two varactors, one forward connected and the other backward connected are configured to adjust a delay of a transition of an incoming signal. Another two varactors, one forward connected and the other backward connected, configured to adjust a delay of a transition of the outgoing signal in accordance with the first voltage and the second voltage.

15 Claims, 2 Drawing Sheets

VOLTAGE-CONTROLLED DELAY BUFFER OF WIDE TUNING RANGE

BACKGROUND OF THE DISCLOSURE

Field of the Disclosure

The present disclosure generally relates to voltage-controlled delay buffers and particularly to voltage-controlled delay buffers having wide tuning range.

Description of Related Art

As is known, a typical delay buffer receives an input signal and outputs an output signal such that the output signal is substantially the same as the input signal except for a delay in time. In practice and particularly in the present disclosure, the input signal is a logical signal. In many applications, it is desirable to make the delay of a delay buffer tunable. A delay buffer with a delay that is tunable is referred to as a variable delay buffer. A variable delay buffer that has a delay that is tunable and can be controlled by a voltage signal is referred to as a voltage-controlled delay buffer.

There are many factors to consider when designing a variable delay buffer. First, the variable delay buffer will inevitably contribute an additive noise and make the output signal noisier than the input signal. It is desirable to alleviate the additive noise. Second, it is usually desirable that the variable delay buffer can have a wide tuning range. Third, an interface of the variable delay buffer with a preceding circuit on an input side and with a succeeding circuit on an output side must be properly handled. In practice, there are trade-offs among the various factors to consider.

In an embodiment, a delay of a voltage-controlled delay buffer comprises an inverter powered by a power supply voltage that is tunable, and the power supply voltage serves as a voltage signal that controls the delay: the lower power supply voltage, the longer delay. This embodiment can have a very wide tuning rage, but has the following drawbacks: first, when the delay needs to be very long, the power supply voltage needs to be very low, making the output signal highly susceptible to an additive noise. Second, the power supply voltage is variable and thus may not interface well with either a preceding circuit or a succeeding circuit.

In an embodiment, a voltage-controlled delay buffer comprises a tunable current source configured to charge a capacitor in accordance with the input signal; the capacitor is charged by the tunable current source when the input signal is high and discharged otherwise; a current of the tunable current source is controlled by a bias voltage that serves as a voltage signal that controls the delay: a smaller current of the tunable current source leads to a longer delay. This embodiment has a draw back that the tunable current source is prone to contributing a low-frequency noise known as "flicker noise" that is often highly detrimental.

What is desired is a voltage-controlled delay buffer that realizes a favorable trade-off between tuning range and noise and does not have an interface issue.

SUMMARY OF THE DISCLOSURE

In an embodiment, a voltage-controlled inverter comprises: a first PMOS transistor configured to enable a pull-up of an output signal at an output node in accordance with an input signal at an input node; a second PMOS transistor configured to enforce the pull-up in accordance with the input signal; a third PMOS transistor configured to assist the pull-up in accordance with a first voltage; a first NMOS transistor configured to enable a pull-down of the output signal in accordance with the input signal; a second NMOS transistor configured to enforce the pull-down in accordance with the input signal; a third NMOS transistor configured to assist the pull-down in accordance with a second voltage; a first forward connected varactor and a first backward connected varactor controlled by the first voltage and the second voltage, respectively and configured to provide a shunt capacitance at the input node; and a second forward connected varactor and a second backward connected varactor controlled by the first voltage and the second voltage, respectively and configured to provide a shunt capacitance at the output node.

In an embodiment, a voltage-controlled delay buffer comprises a plurality of inverters configured in a cascade topology to receive an input signal from a source circuit and output an output signal to a load circuit, said plurality of inverters including a voltage-controlled inverter configured to receive an incoming signal at an input node from a preceding circuit and output an outgoing signal at an output node to a succeeding circuit in accordance with a control by a control signal comprising a first voltage and a second voltage, wherein the voltage-controlled inverter comprises: a first PMOS transistor configured to enable a pull-up of the outgoing signal in accordance with the incoming signal; a second PMOS transistor configured to enforce the pull-up in accordance with the incoming signal; a third PMOS transistor configured to assist the pull-up in accordance with the first voltage; a first NMOS transistor configured to enable a pull-down of the outgoing signal in accordance with the incoming signal; a second NMOS transistor configured to enforce the pull-down in accordance with the incoming signal; a third NMOS transistor configured to assist the pull-down in accordance with the second voltage; a first forward connected varactor and a first backward connected varactor controlled by the first voltage and the second voltage, respectively and configured to provide a shunt capacitance at the input node; and a second forward connected varactor and a second backward connected varactor controlled by the first voltage and the second voltage, respectively and configured to provide a shunt capacitance at the output node.

In an embodiment, a voltage-controlled delay buffer comprises a plurality of inverters configured in a cascade topology to receive an input signal from a source circuit and output an output signal to a load circuit, said plurality of inverters including a voltage-controlled inverter controlled by a control signal comprising a first voltage and a second voltage, wherein the voltage-controlled inverter comprises: a first PMOS transistor, of which a source, a gate, and a drain connect to a power supply node, an input node, and a high-side internal node, respectively; a second PMOS transistor, of which a source, a gate, and a drain connect to the high-side internal node, the input node, and an output node, respectively; a third PMOS transistor, of which a source, a gate, and a drain connect to the high-side internal node, the first voltage, and the output node, respectively; a first NMOS transistor, of which a source, a gate, and a drain connect to ground, the input node, and a low-side internal node, respectively; a second NMOS transistor, of which a source, a gate, and a drain connect to the low-side internal node, the input node, and an output node, respectively; a third NMOS transistor, of which a source, a gate, and a drain connect to the low-side internal node, the second voltage, and the output node, respectively; a first forward connected varactor, of which a positive terminal and a negative terminal connect to the first voltage and the input node, respectively; a second forward connected varactor, of which a positive terminal and a negative terminal connect to the first voltage and the output node, respectively; a first backward connected varactor, of which a positive terminal and a negative terminal connect to the input node and the second voltage, respectively; and a second backward connected varactor, of which a positive terminal and a negative terminal connect to the output node and the second voltage, respectively.

DETAILED DESCRIPTION OF THIS DISCLOSURE

Figure 1:
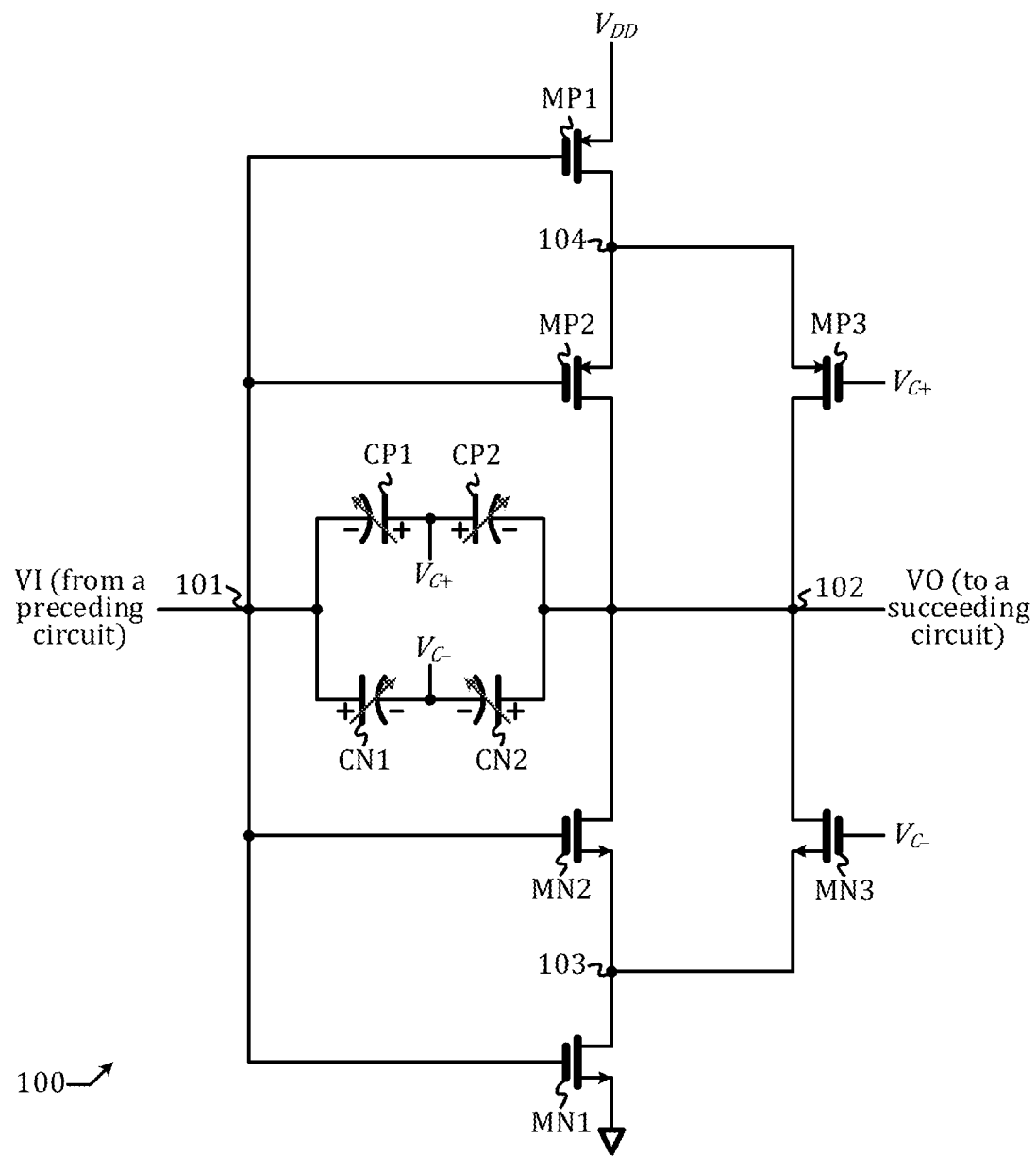
FIG. 1 shows a schematic diagram of a voltage-controlled inverter in accordance with an embodiment of the present disclosure.

The present disclosure is directed to voltage-controlled delay buffer. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "signal," "inverter," "circuit node," "ground," "power supply node," "MOS (metal oxide semiconductor) transistor," "CMOS (complementary metal oxide semiconductor) process technology," "NMOS (n-channel metal oxide semiconductor) transistor," and "PMOS (p-channel metal oxide semiconductor) transistor." Terms and basic concepts like these, when used in a context of microelectronics, are apparent to those of ordinary skill in the art and thus will not be explained in detail here.

Those of ordinary skill in the art understand units such as fF (femto-Farad) and μm (micron) without a need of explanation of these terms.

Those of ordinary skill in the art can read schematics of a circuit comprising components such as capacitors, NMOS transistors, PMOS transistors, and so on, and do not need a verbose description about how one component connects with another in the schematics. Those of ordinary skill in the art can also recognize a ground symbol, a capacitor symbol, a varactor (variable capacitor) symbol, and symbols of PMOS transistor and NMOS transistor, and identify the "source terminal," the "gate terminal," and the "drain terminal" thereof. Pertaining to a MOS transistor, for brevity, hereafter, "source terminal" is simply referred to as "source," "gate terminal" is simply referred to "gate," and "drain terminal" is simply referred to "drain."

A circuit is a collection of at least one transistor, capacitor, resistor, and/or other electronic devices inter-connected in a certain manner to embody a certain function.

In this disclosure, a "circuit node" is frequently simply stated as a "node" for short, when what it means is clear from a context.

A signal is a voltage of a variable level that carries a certain information and can vary with time. A level of the signal at a moment represents a state of the signal at that moment.

A differential signal is a signal comprising a first sub-signal and a second sub-signal denoted by suffixes "+" and "−," respectively, attached in subscript, and a value of said differential signal is represented by a difference between said two sub-signals. A mean value of the first sub-signal and the second sub-signal is called a "common-mode" value of said differential signal.

A logical signal is a voltage signal of two states: a low state and a high state. The low state is also known as a "0" state, while the high stage is also known as a "1" state. Regarding a logical signal Q, "Q is high" or "Q is low," means that is "Q is in the high state" or "Q is in the low state." Likewise, "Q is 1" or "Q is 0," means that is "Q is in the 1 state" or "Q is in the 0 state."

Upon a low-to-high transition of a logical signal, a rising edge occurs; upon a high-to-low transition of a logical signal, a falling edge occurs.

A first logical signal is said to be a logical inversion of a second logical signal if the first logical signal and the second logical signal always have opposite states. That is, when the first logical signal is 1, the second logical signal will be 0; when the first logical signal is 0, the second logical signal will be 1. When a first logical signal is a logical inversion of a second logical signal, the first logical signal is said to be complementary to the second logical signal.

In this present disclosure, a varactor is a two-terminal circuit element of a variable capacitance that comprises a positive terminal marked by "+" and a negative terminal marked by "−"; a capacitance of the varactor increases (decreases) when a voltage at the positive terminal rises (falls) and decreases (increases) when a voltage at the negative terminal rises (falls); when the positive terminal is connected to a control voltage configured to control the variable capacitance, the varactor is said to be forward connected; when the negative terminal is connected to a control voltage configured to control the variable capacitance, the varactor is said to be backward connected.

An inverter receives an input signal and outputs and output signal, wherein the input signal is a logical signal, and the output signal is a logical inversion of the input signal with a delay in time; a low-to-high (high-to-low) transition of the input signal leads to a high-to-low (low-to-high) transition of the output signal with a delay.

A "pull-up" of a logical signal takes place when a PMOS transistor is turned on to connect the logical signal to a power supply node. A "pull-down" of a logical signal takes place when a NMOS transistor is turned on to connect the logical signal to a ground node.

In a context of the present disclosure, a variable delay circuit is a circuit that receives an input signal, which is a logical signal, and outputs an output signal, which is also a logical signal, such that the output signal is of substantially the same waveform as the input signal but having a delay in time that is variable and controlled by a control signal.

A core circuit in this present disclosure is a voltage-controlled inverter. A schematic diagram of a voltage-controlled inverter 100 in accordance with an embodiment of the present disclosure in shown in FIG. 1. For short, hereafter "the voltage-controlled inverter 100" is simply referred to as "inverter 100." Inverter 100 is configured to receive an incoming signal VI received from a preceding circuit via an input node 101 and output an outgoing signal VO delivered to a succeeding circuit via an output node 102 with a delay controlled by a control signal $V_C$ that in a differential signal embodiment comprises two voltages including a first voltage $V_{C+}$ and a second voltage $V_{C-}$. Voltage-controlled inverter 100 comprises: three PMOS transistors including a first PMOS transistor MP1, a second PMOS transistor MP2, and a third PMOS transistor MP3; three NMOS transistors including a first NMOS transistor MN1, a second NMOS transistor MN2, and a third NMOS transistor MN3; and four varactors including a first forward connected varactor CP1, a second forward connected varactor CP2, a first backward connected varactor CN1, and a second backward connected CN2. Throughout this disclosure, "$V_{DD}$" denotes a power supply node. For brevity, hereafter PMOS transistor MP1 (MP2, MP3) is simply referred to as MP1 (MP2, MP3); NMOS transistor MN1 (MN2, MN3) is simply referred to as MN1 (MN2, MN3); the first (second) forward connected varactor CP1 (CP2) is simply referred to as CP1 (CP2); the first (second) backward connected varactor CN1 (CN2) is simply referred to as CN1 (CN2); the incoming signal VI is simple referred to as VI; the outgoing signal VO is simply referred to as VO; and the first (second) voltage $V_{C+}$ ($V_{C-}$) is simply referred to as $V_{C+}$ ($V_{C-}$).

A source, a gate, and a drain of MN1 connect to ground, the input node 101, and a low-side internal node 103, respectively. A source, a gate, and a drain of MN2 connect to the low-side internal node 103, the input node 101, and the output node 102, respectively. A source, a gate, and a drain of MN3 connect to the low-side internal node 103, $V_{C-}$, and the output node 102, respectively. A source, a gate, and a drain of MP1 connect to $V_{DD}$, the input node 101, and a high-side internal node 104, respectively. A source, a gate, and a drain of MP2 connect to the high-side internal node 104, the input node 101, and the output node 102, respectively. A source, a gate, and a drain of MP3 connect to the high-side internal node 104, $V_{C+}$, and the output node 102, respectively. A positive terminal and a negative terminal of CN1 connect to the input node 101 and $V_{C-}$, respectively. A positive terminal and a negative terminal of CN2 connect to the output node 102 and $V_{C-}$, respectively. A positive terminal and a negative terminal of CP1 connect to $V_{C+}$ and the input node 101, respectively. A positive terminal and a negative terminal of CP2 connect to $V_{C+}$ and the output node 102, respectively.

$V_{C+}$ and $V_{C-}$ jointly embody the control signal $V_C$ in a differential signal embodiment so that when $V_{C+}$ rises (falls) by an amount, $V_{C-}$ will fall (rise) by the same amount and consequently a mean value of $V_{C+}$ and $V_{C-}$, i.e., a "common-mode" value, remains unchanged. In an embodiment, a mean value of $V_{C+}$ and $V_{C-}$, i.e., a common-mode value of $V_C$ is equal to half $V_{DD}$.

VI is a logical signal that is pulled down to ground (by a preceding circuit that generates VI) when it is low and pulled up to $V_{DD}$ (by the preceding circuit that generates VI) when it is high. MN1, MN2, MP1, and MP2 form an inverter configured to receive VI and output VO, so that VO is a logical inversion of VI. MP1 enables a pull-up of VO when VI is low; MP2 enforces the pull-up when VI is low; and MP3 assists the pull-up in accordance with $V_{C+}$. On the other hand, MN1 enables a pull-down of VO when VI is high; MN2 enforces the pull-down when VI is high; and MN3 assists the pull-down in accordance with $V_{C-}$. Consider an initial condition wherein VI is low and VO is high. Upon a low-to-high transition of VI, MP1 and MP2 and consequently MP3 are turned off, while MN1 and MN2 are turned on to pull down VO to ground with an assistance provided by MN3, resulting in a high-to-low transition of VO; when $V_{C-}$ is lower (higher), the assistance from MN3 becomes weaker (stronger), causing the high-to-low transition of VO to be slower (higher). Upon a high-to-low transition of VI, MN1 and MN2 and consequently MN3 are turned off, MP1 and MP2 are turned on to pull up VO to $V_{DD}$ with an assistance provided by MP3, resulting in a low-to-high transition of VO; when $V_{C+}$ is higher (lower), the assistance from MP3 becomes weaker (stronger), causing the low-to-high transition of VO to be slower (faster).

In addition, CP1 and CN1 are configured as a shunt capacitor at the input node 101 of a capacitance controlled by $V_{C+}$ and $V_{C-}$, while CN2 and CP2 are configured as a shunt capacitor at the output node 102 of a capacitance controlled by $V_{C+}$ and $V_{C-}$. When $V_{C+}$ is higher (lower) and thus $V_{C-}$ is lower (higher), capacitances of CP1, CN1 are both larger (smaller), making both a low-to-high transition and a high-to-low transition of VI driven by the preceding circuit slower (faster); at the same time, capacitances of CP2 and CN2 are both larger (smaller), making both a low-to-high transition and a high-to-low transition of VO delivered to the succeeding circuit slower (faster). In conclusion, for both VI and VO, when $V_{C+}$ is higher (lower) and thus $V_{C-}$ is lower (higher), both a high-to-low transition and a low-to-high transition are slower (faster), resulting in a longer (shorter) delay of the voltage-controlled inverter 100.

By way of example, but not limitation: the voltage-controlled delay buffer 100 is fabricated on a silicon substrate using a 55 nm CMOS process technology; $V_{DD}$ is 1.2V; W/L (which stands for width/length) of MN1 are 32 µm/120 nm; W/L of MN2 are 6 µm/150 nm; W/L of MN3 are 96 µm/150 nm; W/L of MP1 are 64 µm/120 nm; W/L of MN2 are 12 µm/150 nm; W/L of MN3 are 192 µm/150 nm; and CP1, CP2, CN1, and CN2 are all "NMOS in N-well varactors" with W/L of 3 µm/1 µm that can provide a variable capacitance between 6 fF and 30 fF.

There are numerous merits of voltage-controlled inverter 100. First, the variable delay is jointly controlled by the driving capabilities of the two MOS transistors MP3 and MN3 and capacitances of the four varactors CP1, CP2, CN1, and CN2. Therefore, a tuning range can be very wide, due to applying two mechanisms of control at the same time. Second, once the preceding circuit and the succeeding circuit use the same power supply voltage $V_{DD}$, there is no interface issue, as both VI and VO are logical signals having a low state of 0 V and a high stage of $V_{DD}$. Third, NMOS transistor MN2 is always turned on to provide a driving force to pull down VO upon a low-to-high transition of VI, while PMOS transistor MP2 is always turned on to provide a driving force to pull up VO upon a high-to-low transition of VI, regardless of a value of the control signal $V_C$, therefore an extreme scenario of having an extremely low driving capability and consequently being highly susceptible to a noise of the voltage-controlled inverter 100 can be avoided. Fourth, both the control of the two MOS transistors MP3 and MN3 and the control of the four varactors CP1, CP2, CN1, and CN2 have the same common-mode voltage of half $V_{DD}$, therefore, both VI and VO can have a symmetrical response in both low-to-high and high-to-low transitions; in other words, voltage-controlled inverter 100 is inherently balanced and can have a symmetrical response.

Figure 2A:
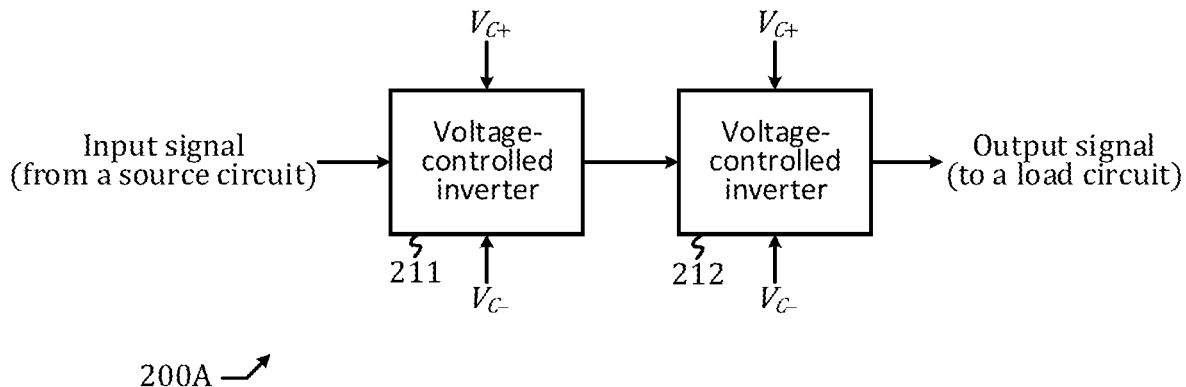
FIG. 2A shows a schematic diagram of a voltage-controlled delay buffer in accordance with a first embodiment of the present disclosure.
Figure 2B:
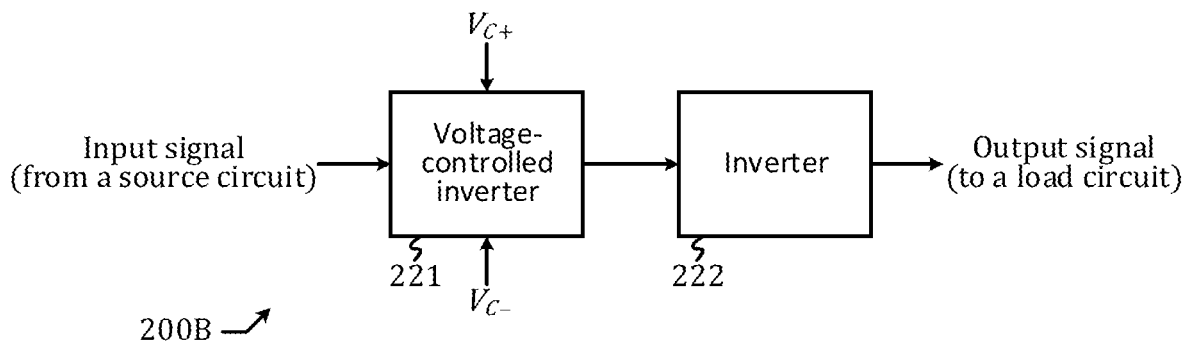
FIG. 2B shows a schematic diagram of a voltage-controlled delay buffer in accordance with a second embodiment of the present disclosure.

Voltage-controlled inverter 100 can be used to construct a voltage-controlled delay buffer. In a first embodiment as depicted in a schematic diagram shown in FIG. 2A, a voltage-controlled delay buffer 200A comprises a first voltage-controlled inverter 211 and a second voltage-controlled inverter 212 configured in a cascade topology to receive an input signal from a source circuit and output an output signal to a load circuit in accordance with a control signal $V_C$ that in a differential signal embodiment comprises two voltages $V_{C+}$ and $V_{C-}$. The two voltage-controlled inverters 211 and 212 are instantiated from the voltage-controlled inverter 100 of FIG. 1. In a second embodiment as depicted in a schematic diagram shown in FIG. 2B, a voltage-controlled delay buffer 200B comprises a voltage-controlled inverter 221 and an inverter 222 configured in a cascade topology to receive an input signal from a source circuit and output an output signal to load circuit in accordance with a control signal $V_C$ that in a differential signal embodiment comprises two voltages $V_{C+}$ and $V_{C-}$. The voltage-controlled inverters 221 is instantiated from the voltage-controlled inverter 100 of FIG. 1, while the inverter 222 can be embodied by whatever inverter circuit known in the prior art at a discretion of a circuit designer.

A plurality of voltage-controlled delay buffers can be configured in a cascade topology to embody a single voltage-controlled delay buffer; this is obvious to those of ordinary skill in the art and therefore not further explained.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A voltage-controlled inverter comprising:
   a first PMOS (p-channel metal oxide semiconductor) transistor configured to enable a pull-up of an output signal at an output node in accordance with an input signal at an input node;
   a second PMOS transistor configured to enforce the pull-up in accordance with the input signal;
   a third PMOS transistor configured to assist the pull-up in accordance with a first voltage;
   a first NMOS (n-channel metal oxide semiconductor) transistor configured to enable a pull-down of the output signal in accordance with the input signal;
   a second NMOS transistor configured to enforce the pull-down in accordance with the input signal;
   a third NMOS transistor configured to assist the pull-down in accordance with a second voltage;
   a first forward connected varactor and a first backward connected varactor controlled by the first voltage and the second voltage, respectively and configured to provide a shunt capacitance at the input node; and
   a second forward connected varactor and a second backward connected varactor controlled by the first voltage and the second voltage, respectively and configured to provide a shunt capacitance at the output node.

2. The voltage-controlled inverter of claim 1, wherein the input signal is a logical signal.

3. The voltage-controlled inverter of claim 2, wherein when the first voltage rises, the second voltage falls, and vice versa.

4. The voltage-controlled inverter of claim 3, wherein a mean value of the first voltage and the second voltage remains unchanged when a value of the first voltage changes.

5. The voltage-controlled inverter of claim 4, wherein the mean value is equal to half of a power supply voltage of the voltage-controlled inverter.

6. A voltage-controlled delay buffer comprising a plurality of inverters configured in a cascade topology to receive an input signal from a source circuit and output an output signal to a load circuit, said plurality of inverters including a voltage-controlled inverter configured to receive an incoming signal from a preceding circuit and output an outgoing signal to a succeeding circuit in accordance with a control by a control signal comprising a first voltage and a second voltage, wherein the voltage-controlled inverter comprises:
   a first PMOS (p-channel metal oxide semiconductor) transistor configured to enable a pull-up of the outgoing signal in accordance with the incoming signal;
   a second PMOS transistor configured to enforce the pull-up in accordance with the incoming signal;
   a third PMOS transistor configured to assist the pull-up in accordance with the first voltage;
   a first NMOS (n-channel metal oxide semiconductor) transistor configured to enable a pull-down of the outgoing signal in accordance with the incoming signal;
   a second NMOS transistor configured to enforce the pull-down in accordance with the incoming signal;
   a third NMOS transistor configured to assist the pull-down in accordance with the second voltage;
   a first forward connected varactor and a first backward connected varactor controlled by the first voltage and the second voltage, respectively and configured to provide a shunt capacitance at an input node; and
   a second forward connected varactor and a second backward connected varactor controlled by the first voltage and the second voltage, respectively and configured to provide a shunt capacitance at an output node.

7. The voltage-controlled delay buffer of claim 6, wherein the input signal is a logical signal.

8. The voltage-controlled delay buffer of claim 7, wherein when the first voltage rises, the second voltage falls, and vice versa.

9. The voltage-controlled delay buffer of claim 8, wherein a mean value of the first voltage and the second voltage remains unchanged when a value of the first voltage changes.

10. The voltage-controlled delay buffer of claim 9, wherein the mean value is equal to half of a power supply voltage of the voltage-controlled inverter.

11. A voltage-controlled delay buffer comprising a plurality of inverters configured in a cascade topology to receive an input signal from a source circuit and output an output signal to a load circuit, said plurality of inverters including a voltage-controlled inverter controlled by a control signal comprising a first voltage and a second voltage, wherein the voltage-controlled inverter comprises:
   a first PMOS (p-channel metal oxide semiconductor) transistor, of which a source, a gate, and a drain connect to a power supply node, an input node, and a high-side internal node, respectively;
   a second PMOS transistor, of which a source, a gate, and a drain connect to the high-side internal node, the input node, and an output node, respectively;
   a third PMOS transistor, of which a source, a gate, and a drain connect to the high-side internal node, the first voltage, and the output node, respectively;
   a first NMOS transistor, of which a source, a gate, and a drain connect to ground, the input node, and a low-side internal node, respectively;
   a second NMOS transistor, of which a source, a gate, and a drain connect to the low-side internal node, the input node, and an output node, respectively;

a third NMOS transistor, of which a source, a gate, and a drain connect to the low-side internal node, the second voltage, and the output node, respectively;
a first forward connected varactor, of which a positive terminal and a negative terminal connect to the first voltage and the input node, respectively;
a second forward connected varactor, of which a positive terminal and a negative terminal connect to the first voltage and the output node, respectively;
a first backward connected varactor, of which a positive terminal and a negative terminal connect to the input node and the second voltage, respectively; and
a second backward connected varactor, of which a positive terminal and a negative terminal connect to the output node and the second voltage, respectively.

12. The voltage-controlled delay buffer of claim 11, wherein the input signal is a logical signal.

13. The voltage-controlled delay buffer of claim 12, wherein when the first voltage rises, the second voltage falls, and vice versa.

14. The voltage-controlled delay buffer of claim 13, wherein a mean value of the first voltage and the second voltage remains unchanged when a value of the first voltage changes.

15. The voltage-controlled delay buffer of claim 14, wherein the mean value is equal to half of a power supply voltage of the voltage-controlled inverter.

\* \* \* \* \*